United States Patent
Park et al.

(10) Patent No.: US 11,958,987 B2
(45) Date of Patent: Apr. 16, 2024

(54) COVER WINDOW FOR FLEXIBLE DISPLAY DEVICE AND FLEXIBLE DISPLAY DEVICE

(71) Applicant: LG CHEM, LTD., Seoul (KR)

(72) Inventors: Jin Young Park, Daejeon (KR); Bi Oh Ryu, Daejeon (KR); Young Ji Tae, Daejeon (KR); Youngseok Park, Daejeon (KR); Yongjoon Heo, Daejeon (KR); Yeongrae Chang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 741 days.

(21) Appl. No.: 15/734,971

(22) PCT Filed: Oct. 25, 2019

(86) PCT No.: PCT/KR2019/014203
§ 371 (c)(1),
(2) Date: Dec. 3, 2020

(87) PCT Pub. No.: WO2020/085869
PCT Pub. Date: Apr. 30, 2020

(65) Prior Publication Data
US 2021/0230449 A1 Jul. 29, 2021

(30) Foreign Application Priority Data
Oct. 26, 2018 (KR) .................. 10-2018-0129194

(51) Int. Cl.
*C08G 69/32* (2006.01)
*B32B 27/30* (2006.01)
(Continued)

(52) U.S. Cl.
CPC .......... *C09D 177/06* (2013.01); *B32B 27/308* (2013.01); *B32B 27/34* (2013.01);
(Continued)

(58) Field of Classification Search
CPC ...... C09D 177/06; C09D 179/08; C09D 4/06; C08F 293/00; C08G 69/265; C08G 69/32;
(Continued)

(56) References Cited

U.S. PATENT DOCUMENTS 8,895,677 B2 11/2014 Cho et al.
10,391,750 B2 8/2019 Kim et al.
(Continued)

FOREIGN PATENT DOCUMENTS

EP 3392295 A1 10/2018
JP 2018-100395 A 6/2018
(Continued)

OTHER PUBLICATIONS

International Search Report for PCT/KR2019/014203 dated Feb. 12, 2020, 5 pages.

*Primary Examiner* — John D Freeman
(74) *Attorney, Agent, or Firm* — ROTHWELL, FIGG, ERNST & MANBECK, P.C.

(57) ABSTRACT

The present disclosure relates to a cover window for a flexible display device including a polymer substrate including a polyamide resin; and a hard coating layer formed on at least one surface of the polymer substrate, wherein a yellow index of the polymer substrate measured in accordance with STM E 313 is 4.00 or less, and an elastic modulus of the polymer substrate measured at a strain rate of 12.5 mm/min in accordance with ISO 527-3 is 4 to 9 GPa.

16 Claims, 1 Drawing Sheet

(51) Int. Cl.
*B32B 27/34* (2006.01)
*C08F 293/00* (2006.01)
*C08G 69/26* (2006.01)
*C09D 177/06* (2006.01)
*C09D 179/08* (2006.01)
*H10K 50/84* (2023.01)
*H10K 77/10* (2023.01)
*H10K 102/00* (2023.01)

(52) U.S. Cl.
CPC .......... *C08F 293/00* (2013.01); *C08G 69/265* (2013.01); *C08G 69/32* (2013.01); *C09D 179/08* (2013.01); *H10K 50/841* (2023.02); *H10K 77/111* (2023.02); *B32B 2307/412* (2013.01); *B32B 2307/51* (2013.01); *B32B 2307/536* (2013.01); *B32B 2457/20* (2013.01); *H10K 2102/311* (2023.02)

(58) Field of Classification Search
CPC .... C08G 73/14; H10K 50/841; H10K 77/111; H10K 2102/311; C08K 9/06; C08K 2201/011; C08K 2201/014; Y02E 10/549; G02F 1/1333; G02F 1/133305; B32B 27/08; B32B 27/20; B32B 27/281; B32B 27/308; B32B 27/34; B32B 2307/412; B32B 2307/51; B32B 2457/20; C08L 79/08
See application file for complete search history.

(56) References Cited

U.S. PATENT DOCUMENTS

| | | | |
|---|---|---|---|
| 10,809,421 | B2 | 10/2020 | Song |
| 2012/0296037 | A1 | 11/2012 | Cho et al. |
| 2017/0183462 | A1 | 6/2017 | Song et al. |
| 2017/0190880 | A1 | 7/2017 | Chae et al. |
| 2019/0153161 | A1 | 5/2019 | Ryu et al. |
| 2019/0217587 | A1* | 7/2019 | Sawamoto ............... C08J 7/042 |
| 2019/0310396 | A1 | 10/2019 | Matsumoto et al. |
| 2020/0407501 | A1* | 12/2020 | Ryu ........................ C08L 77/10 |

FOREIGN PATENT DOCUMENTS

| | | | |
|---|---|---|---|
| KR | 10-2012-0129319 A | 11/2012 | |
| KR | 10-2015-0077177 A | 7/2015 | |
| KR | 10-2016-0003606 A | 1/2016 | |
| KR | 10-2016-0103681 A | 9/2016 | |
| KR | 10-2017-0028084 A | 3/2017 | |
| KR | 10-2017-0076171 A | 7/2017 | |
| KR | 10-2017-0080532 A | 7/2017 | |
| KR | 10-1796174 B1 | 11/2017 | |
| KR | 10-2018-0044189 A | 5/2018 | |
| KR | 10-2018-0071943 A | 6/2018 | |
| KR | 10-2018-0098003 A | 9/2018 | |
| WO | 2018-116598 A1 | 6/2018 | |
| WO | WO-2019194542 A1* | 10/2019 | ............. B32B 27/08 |

* cited by examiner

COVER WINDOW FOR FLEXIBLE DISPLAY DEVICE AND FLEXIBLE DISPLAY DEVICE

TECHNICAL FIELD

Cross-Reference to Related Application

This application is a 35 U.S.C. 371 National Phase Entry Application from PCT/KR2019/014203, filed on Oct. 25, 2019, designating the United States, which claims the benefits of Korean Patent Application No. 10-2018-0129194 filed on Oct. 26, 2018 with the Korean Intellectual Property Office, the disclosures of which are incorporated herein by reference in their entirety.

The present disclosure relates to a cover window for a flexible display device and a display device.

BACKGROUND OF THE INVENTION

Recently, with the development of mobile devices such as smartphones and tablet PCs, thinning and slimming of substrates for display are required. Glass or tempered glass is commonly used as a material having excellent mechanical properties on windows or front boards for displays of mobile devices. However, the glass causes the weight increase of the mobile devices due to its own weight, and has a problem of breakage due to an external impact.

Accordingly, the research for plastic resin is actively underway as a material which can replace the glass. A plastic resin film is lightweight and less fragile, and thus is suitable for the trend of pursuing lighter mobile devices. Specifically, in order to arrive at a film having high hardness and abrasion resistance, films coated with a hard coating layer made of plastic resins on the substrate have been proposed.

As a method of improving the surface hardness of the hard coating layer, a method of increasing the thickness of the hard coating layer can be considered. In order to ensure the surface hardness enough to replace the glass, the hard coating layer needs to have a certain thickness. However, as the thickness of the hard coating layer is increased, the surface hardness may be increased but larger wrinkles or curls are formed due to curing shrinkage of the hard coating layer, and at the same time cracking and peeling of the hard coating layer are likely to occur. Therefore, it may not be easily applied into practice.

Meanwhile, a display in which a part of the display device is bent or flexibly warped for aesthetic and functional reasons has recently been attracting attention, and this tendency is noticeable particularly in mobile devices such as smartphones and tablet PCs. However, since glass is not suitable for use as a cover plate for protecting such a flexible display, it needs to be replaced with a plastic resin or the like. However, for that purpose, it is not easy to produce a film having sufficient flexibility while exhibiting a glass level of high hardness.

BRIEF SUMMARY OF THE INVENTION

In the present disclosure, there is provided a cover window for a flexible display device that exhibits high hardness while satisfying a property balance of flexibility and high hardness at the same time, and is hardly damaged by repetitive bending or folding operations, thereby easily applied to a bendable, flexible, rollable, or foldable mobile device, or display device.

In the present disclosure, there is also provided a flexible display device including the cover window.

In the present disclosure, there is provided a cover window for a flexible display device including a polymer substrate including a polyamide resin; and a hard coating layer formed on at least one surface of the polymer substrate, wherein the polyamide resin includes a first polyamide segment and a second polyamide segment each containing benzene-1,3-dicarbonyl group and benzene-1,4-dicarbonyl group in different molar ratios, a yellow index of the polymer substrate measured in accordance with STM E 313 is 4.00 or less, and an elastic modulus of the polymer substrate measured at a strain rate of 12.5 mm/min in accordance with ISO 527-3 is 4 to 9 GPa.

In the present disclosure, there is also provided a flexible display device including the above cover window for a flexible display device.

DETAILED DESCRIPTION OF THE INVENTION

Hereinafter, the cover window for a flexible display device and the flexible according to specific embodiments of the present disclosure will be described in more detail.

In the present disclosure, "flexible" means a state having flexibility to such an extent that cracks of 3 mm or more in length do not occur when wound on a cylindrical mandrel having a diameter of 3 mm. Therefore, the flexible plastic film of the present disclosure can be applied to a cover film of a bendable, flexible, rollable, or foldable display.

According to an embodiment of the present disclosure, there is provided a cover window for a flexible display device including a polymer substrate including a polyamide resin; and a hard coating layer formed on at least one surface of the polymer substrate, wherein a yellow index of the polymer substrate measured in accordance with STM E 313 is 4.00 or less, and an elastic modulus of the polymer substrate measured at a strain rate of 12.5 mm/min in accordance with ISO 527-3 is 4 to 9 GPa. At this time, the polyamide resin may include a first polyamide segment and a second polyamide segment each containing benzene-1,3-dicarbonyl group and benzene-1,4-dicarbonyl group in different molar ratios.

The present inventors conducted a study on an optical laminate applicable to a flexible display device having a thinner thickness, and confirmed through experiments that the cover window including a polyamide resin, a polymer substrate having the above-described characteristics and a hard coating layer exhibits high hardness while satisfying a property balance of flexibility and high hardness at the same time, and is hardly damaged by repetitive bending or folding operations, thereby easily applied to a bendable, flexible, rollable, or foldable mobile device, or display device. And they have completed the invention.

Since the cover window for a flexible display device may have sufficient properties to replace tempered glass, or the like, it may not only be broken by pressure or force applied from the outside, but also may have characteristics of being sufficiently bent and folded.

More specifically, the cover window for a flexible display device may have a crack-free characteristic when wound on a mandrel having a diameter of 3 mm.

In particular, as the cover window for a flexible display device includes the polymer substrate including a polyamide resin, it may have optical properties such as high transparency along with excellent mechanical properties and heat resistance. In addition, due to the polymer structure and characteristics of the polyamide resin, it is possible to simultaneously satisfy a property balance of flexibility and high hardness, and it is possible to prevent damage to the internal structure by repetitive bending or folding operations.

Specifically, the polymer substrate may have a yellow index measured in accordance with STM E 313 of 4.00 or less, 3.8 or less, or 1.00 to 4.00.

In addition, the polymer substrate may have an elastic modulus measured at a strain rate of 12.5 mm/min in accordance with ISO 527-3 of 4 to 9 GPa, or 5.0 to 7.5 GPa.

In addition, the polymer substrate may have an elongation measured in accordance with ISO 527-3 of about 10% or more, preferably about 14% or more, or to 20%.

As the polymer substrate has the above-described characteristics, it is possible to achieve high hardness and excellent flexibility while having a low yellow index, and accordingly, the cover window for a flexible display of the embodiment may have high transparency, high hardness and high flexibility at the same time.

Meanwhile, the cover window for a flexible display device of the above embodiment may have a light transmittance of 90.0% or more with respect to light having a wavelength of 550 nm, and a haze of 0.6% or less, or 0.5% or less.

In addition, the cover window for a flexible display device of the above embodiment may have a yellow index of 3.0 or less, 3.0 to 1.0, or 1.5 to 2.5.

Meanwhile, the polyamide resin may be a polyamide block copolymer including A) an amide bond by an aromatic diamino group and a benzene-dicarbonyl group; and B) b1) a first polyamide segment in which a ratio of benzene-1,3-dicarbonyl group to a total of benzene-1,3-dicarbonyl group and benzene-1,4-dicarbonyl group is 20 mol % or less, and b2) a second polyamide segment in which a ratio of benzene-1,3-dicarbonyl group to a total of benzene-1,3-dicarbonyl group and benzene-1,4-dicarbonyl group is more than 20 mol %.

The above-mentioned polyamide block copolymer will be described in more detail.

The polyamide block copolymer includes both I) an amide repeating unit (hereinafter, a first amide repeating unit) in which an amine group of the aromatic diamine monomer and a carbonyl group of the isophthaloyl-based monomer form an amide bond, and II) an amide repeating unit (hereinafter, a second amide repeating unit) in which an amine group of the aromatic diamine monomer and a carbonyl group of the terephthaloyl-based monomer form an amide bond.

In addition, the copolymer includes a plurality of segments having different compositions and physical properties, and each segment is in the form of a block copolymer including both the first amide repeating unit and the second amide repeating unit.

At this time, among the segments of the copolymer, a segment having a ratio of benzene-1,3-dicarbonyl group to a total of benzene-1,3-dicarbonyl group derived from an isophthaloyl-based monomer and benzene-1,4-dicarbonyl group derived from a terephthaloyl-based monomer of 20 mol % or less is referred to as a first polyamide segment.

In addition, among the segments of the copolymer, a segment having a ratio of benzene-1,3-dicarbonyl group to a total of benzene-1,3-dicarbonyl group derived from an isophthaloyl-based monomer and benzene-1,4-dicarbonyl group derived from a terephthaloyl-based monomer of more than 20 mol % is referred to as a second polyamide segment.

When explained again on the basis of the amide repeating unit, a ratio of the first amide repeating unit to a total of the first amide repeating unit and the second amide repeating unit is 20 mol % or less in the first polyamide segment, and a ratio of the first amide repeating unit to a total of the first amide repeating unit and the second amide repeating unit is more than 20 mol % in the second polyamide segment.

At this time, in the polyamide block copolymer, a molar ratio of the first polyamide segment to the second polyamide segment (or a ratio of amide repeating units) is maintained in the range of 1:0.5 to 1:10.

The first polyamide segment may have the ratio of benzene-1,3-dicarbonyl group to a total of benzene-1,3-dicarbonyl group and benzene-1,4-dicarbonyl group of about 2 mol % or more and about 20 mol % or less, more preferably about 2 mol % or more and about 5 mol % or less.

The second polyamide segment may have the ratio of benzene-1,3-dicarbonyl group to a total of benzene-1,3-dicarbonyl group and benzene-1,4-dicarbonyl group of more than about 20 mol % and about 40 mol % or less.

The repeating unit derived from the benzene-1,3-dicarbonyl group, that is, an isophthaloyl-based monomer (IPC), may interfere with chain packing and alignment in the polymer due to bent molecular geometry. In addition, it may expand amorphous region in the polyamide copolymer, thereby improving optical properties and folding endurance of the polyamide film.

The repeating unit derived from the benzene-1,4-dicarbonyl group, that is, a terephthaloyl-based monomer (TPC), may maintain chain packing and alignment in the polymer due to linear molecular geometry. In addition, it may expand crystalline region in the polyamide copolymer, thereby improving surface hardness and mechanical properties of the polyamide film.

Therefore, the first polyamide segment in which the ratio of benzene-1,3-dicarbonyl group to a total of benzene-1,3-dicarbonyl group and benzene-1,4-dicarbonyl group is about 20 mol % or less may impart relatively good surface hardness and mechanical properties to the polyimide film.

In addition, the second polyamide segment in which the ratio of benzene-1,3-dicarbonyl group to a total of benzene-1,3-dicarbonyl group and benzene-1,4-dicarbonyl group is more than about 20 mol % may impart relatively good optical properties and folding endurance to the polyimide film.

The polyamide block copolymer includes both the first polyamide segment and the second polyamide segment described above, and particularly, the ratio of the first polyamide segment to the second polyamide segment (or a ratio of amide repeating units) is maintained in the range of about 1:0.5 to about 1:10 in the entire polyamide block copolymer. Thus, advantages of each segment can be realized very effectively in the polyamide film prepared using the same.

In each segment described above, a polymerization type of the aromatic diamine group and the benzene-dicarbonyl group may be a block copolymerization in which certain repeating units are alternately repeated, or a random copolymerization having no specific rules for repeating. However, the entire polyimide copolymer must be in the form of a block copolymer including the different segments in which each segment satisfies the above-described ratio of benzene-1,3-dicarbonyl group and benzene-1,4-dicarbonyl group.

The polyamide block copolymer may have the ratio of benzene-1,3-dicarbonyl group to a total of benzene-1,3-dicarbonyl group and benzene-1,4-dicarbonyl group of about 5 to about 25 mol % in the entire copolymer.

That is, since the ratio of benzene-1,3-dicarbonyl group in the entire copolymer including all of the segments, as well as the ratio of benzene-1,3-dicarbonyl group and benzene- 1,4-dicarbonyl group in each segment, is within the above range, the above-mentioned polyamide film may have excellent optical properties such as haze and yellow index, and at the same time, excellent mechanical properties such as folding endurance and surface hardness.

The above-mentioned aromatic diamino group may be derived from an aromatic diamine monomer containing two amino groups at the ends around the aromatic ring. For example, the aromatic diamino group may be derived from at least one selected from the group consisting of 2,2'-bis(trifluoromethyl)-4,4'-biphenyldiamine, 2,2'-dimethyl-4,4'-diaminobenzidine, 4,4'-diaminodiphenyl sulfone, 4,4'-(9-fluorenylidene)dianiline, bis(4-(4-aminophenoxy)phenyl) sulfone, 2,2',5,5'-tetrachlorobenzidine, 2,7-diaminofluorene, 4,4-diaminooctafluorobiphenyl, m-phenylenediamine, p-phenylenediamine, 4,4'-oxydianiline, 2,2'-dimethyl-4,4'-diaminobiphenyl, 2,2-bis[4-(4-aminophenoxy)phenyl]propane, 1,3-bis(4-aminophenoxy)benzene, and 4,4'-diaminobenzanilide.

More preferably, the aromatic diamine monomer may be 2,2'-bis(trifluoromethyl)-4,4'-biphenyldiamine (TFDB) or 2,2'-dimethyl-4,4'-diaminobenzidine.

The polyamide block copolymer may further include a carbonyl group derived from an aromatic dicarbonyl monomer or a tricarbonyl monomer, in addition to the benzene-1,3-dicarbonyl group and benzene-1,4-dicarbonyl group, as a carbonyl group forming an amide bond with the above-mentioned aromatic diamino group.

Examples of the aromatic dicarbonyl monomer include 4,4'-biphenyldicarbonyl chloride, and the like, and examples of the aromatic tricarbonyl monomer include trimesoyl chloride, and the like.

In particular, the aromatic tricarbonyl monomer may act as a cross-linking agent in the copolymerization to further improve mechanical properties of the polyamide block copolymer.

In order to achieve this effect, the aromatic tricarbonyl monomer may be included in an amount of about 0.01 mol % or more, about 0.025 mol % or more, or about 0.05 mol % or more, and about 5.0 mol % or less, about 2.5 mol % or less, about 1.5 mol % or less, or about 1.25 mol % or less of the total carbonyl-derived monomer. When the aromatic tricarbonyl monomer is excessively used, optical properties of the polyamide block copolymer to be prepared may be deteriorated and flexibility may be lowered.

In the mean time, polymerization conditions for preparing the polyamide containing the amide bond by the aromatic diamino group and the benzene-dicarbonyl group by polymerizing the aromatic diamine monomer and the aromatic dicarbonyl monomer are not particularly limited. However, in order to separately form the above-described first and second polyamide segments, the polymerization may be carried out twice or more.

Specifically, the polymerization method may include the steps of:

b11) mixing a benzene-1,3-dicarbonyl monomer, a benzene-1,4-dicarbonyl monomer, and an aromatic diamine monomer, b12) wherein the benzene-1,3-dicarbonyl monomer is included in an amount of 20 mol % or less based on a total of the benzene-1,3-dicarbonyl monomer and the benzene-1,4-dicarbonyl monomer, b13) and then forming an amide bond between the amine group and the carbonyl group to form a first polyamide segment; and b21) mixing a benzene-1,3-dicarbonyl monomer, a benzene-1,4-dicarbonyl monomer, and an aromatic diamine monomer, b22) wherein the benzene-1,3-dicarbonyl monomer is included in an amount of more than 20 mol % based on a total of the benzene-1,3-dicarbonyl monomer and the benzene-1,4-dicarbonyl monomer, b23) and then forming an amide bond between the amine group and the carbonyl group to form a second polyamide segment.

Herein, the ratio of the monomers may be controlled such that the molar ratio of the first polyamide segment to the second polyamide segment is 1:0.5 to 1:10.

The polymerization reaction for forming the polyamide may be carried out by a solution polymerization under an inert gas atmosphere at a temperature of about minus 25° C. to about 25° C., more preferably about minus 25° C. to 0° C. Specific examples of the above-mentioned monomers and the like are as described above in the polyamide block copolymer.

Herein, as the reaction solvent, N,N-dimethylformamide, N,N-dimethylacetamide, dimethylsulfoxide, acetone, N-methyl-2-pyrrolidone, tetrahydrofuran, chloroform, gamma-butyrolactone, or the like may be used.

The polyamide block copolymer may have a weight average molecular weight of about 10,000 to about 700,000 g/mol, about 10,000 to about 500,000 g/mol, about 100,000 to about 500,000 g/mol, or about 300,000 to about 450,000 g/mol.

In the present disclosure, the weight average molecular weight refers to a weight average molecular weight measured by a GPC method and calibrated with polystyrene. In the process of measuring the weight average molecular weight calibrated with polystyrene by a GPC method, a known analyzer, a detector such as a refractive index detector, and an analyzing column may be used. Conventional temperature conditions, solvents, and flow rates can be applied. For example, it may be performed at a temperature of 30° C. using a chloroform solvent at a flow rate of 1 mL/min.

As described above, the cover window for a flexible display device of the embodiment may include a hard coating layer formed on at least one surface of the polymer substrate and having a pencil hardness of 5H or more under a load of 750 g.

The hard coating layer may have a pencil hardness of 5H or more, 6H or more, or 7H or more under a load of 750 g.

As described above, flexibility can be generally secured in a film or optical laminate having a thin thickness, but it is not easy to secure durability against repetitive bending or folding while maintaining high surface strength.

On the other hand, the cover window for a flexible display device of the embodiment has the above-described features by including a hard coating layer having high hardness and high durability against repetitive bending or folding operations together with the polymer substrate with the above-described features.

Specifically, the hard coating layer may include a binder resin.

Specific examples of the binder resin are not particularly limited, and the binder resin may be, for example, a polymer or copolymer of monomer(s) having a photocurable reactor. Specifically, it may be a polymer or copolymer formed from (meth)acrylate-based monomers or oligomers, vinyl-based monomers or oligomers, or the like.

For example, the binder resin may include a polymer or copolymer of 3- to 6-functional (meth)acrylate-based monomers.

The 3- to 6-functional acrylate-based monomer or oligomer may be trimethylolpropane triacrylate (TMPTA), trimethylolpropaneethoxy triacrylate (TMPEOTA), glycerin propoxylated triacrylate (GPTA), pentaerythritol tetra acrylate (PETA) or dipentaerythritol hexaacrylate (DPHA). The 3- to 6-functional acrylate-based monomer or oligomer may be used alone or in combination of different types.

The (meth)acrylate-based monomer or oligomer or vinyl-based monomer or oligomer may have a weight average molecular weight (Mw) of about 200 to about 2,000 g/mol, about 200 to about 1,000 g/mol, or about 200 to about 500 g/mol.

The 3- to 6-functional acrylate-based monomer may have an acrylate equivalent weight of about 50 to about 300 g/mol, about 50 to about 200 g/mol, or about 50 to about 150 g/mol.

In addition, the binder resin may include a cross-linked copolymer of a 3- to 6-functional acrylate-based monomer with a 7- to 20-functional urethane acrylate-based monomer or oligomer.

The 7- to 20-functional urethane acrylate-based monomer or oligomer is cross-linked with the 3- to 6-functional acrylate-based monomer or oligomer to form a copolymer, and may impart high hardness, flexibility and impact resistance to the coating layer formed after curing. The 7- to 20-functional urethane acrylate-based monomer or oligomer may be used alone or in combination of different types.

The cross-linked copolymer may contain the 3- to 6-functional acrylate-based monomer or oligomer and the 7- to 20-functional urethane acrylate-based monomer or oligomer in a weight ratio of about 1:9 to about 5:5, preferably 1:9 to about 4:6, more preferably about 1:9 to about 3.5:6.5. By including the cross-linked copolymer in which the 3- to 6-functional acrylate-based monomer or oligomer and the 7- to 20-functional urethane acrylate-based are cross-linked in the weight ratio described above, it can exhibit sufficient flexibility and achieve good physical properties such as high hardness at the same time.

The 7- to 20-functional urethane acrylate-based monomer or oligomer may have a weight average molecular weight of about 2,000 to about 8,000 g/mol, about 3,000 to about 6,000 g/mol, or about 3,000 to about 5,000 g/mol, which may be preferable for the optimization of physical properties of the coating layer.

In addition, the hard coating layer may include inorganic nanoparticles dispersed in the binder resin.

The inorganic particles may be, for example, a metal atom such as silica, aluminum, titanium, and zinc, or an oxide or nitride thereof, and silica particles, aluminum oxide particles, titanium oxide particles, or zinc oxide particles may be used.

The hard coating layer may include two or more types of inorganic particles having different average radii together with the binder resin. In this case, the two or more types of inorganic particles may include first inorganic particles having an average radius of 20 to 35 nm and second inorganic particles having an average radius of 40 to 130 nm.

The average radius of each of the first inorganic particles and the second inorganic particles can be confirmed by a commonly known method. For example, it may be calculated and derived by measuring a radius of individual particles identified in an electron micrograph (SEM, TEM, etc.) of the hard coating layer, or may be calculated through X-ray scattering experiments.

Meanwhile, a content of the inorganic nanoparticles included in the hard coating layer is not particularly limited, but preferably, the hard coating layer may include 20 to 80 parts by weight of the inorganic nanoparticles based on 100 parts by weight of the binder resin.

When the content of the inorganic nanoparticles included in the hard coating layer is too small, hardness of the hard coating layer may be lowered. In addition, when the content of the inorganic nanoparticles included in the hard coating layer is too high, hardness may be increased, but flexibility of the cover window may be significantly reduced or durability against repetitive bending or folding operations may also be reduced.

The polymer substrate may have a thickness of 5 μm to 300 μm, 20 μm to 200 μm, or 20 μm to 100 μm. If the thickness of the substrate is less than 5 μm, there is a risk of breakage or curl when forming the coating layer, and it may be difficult to achieve high hardness. On the other hand, if the thickness exceeds 300 μm, flexibility may be reduced and a flexible film may be difficult to form.

The hard coating layer may have a thickness of 5 μm to 50 μm. When the thickness of the hard coating layer is excessively thick, flexibility or durability against repetitive bending or folding operations of the cover window for a flexible display device may be deteriorated.

Meanwhile, the cover window for a flexible display device may be provided by applying a coating composition for forming the hard coating layer on at least one surface of the polymer substrate and photocuring it.

The method of coating the coating composition is not particularly limited, as long as it can be used in the related art. For example, a bar-coating method, a knife-coating method, a roll-coating method, a blade-coating method, a die-coating method, a microgravure-coating method, a comma-coating method, a slot die-coating method, a lip-coating method, or a solution casting method may be used.

At least one selected from a layer, a membrane, a film and the like such as a plastic resin film, a cohesive film, a release film, a conductive film, a conductive layer, a liquid crystal layer, a coating layer, a cured resin layer, a non-conductive film, a metal mesh layer or a patterned metal layer may be included on the top surface of the hard coating layer or between the polymer substrate and the hard coating layer.

For example, an antistatic layer having conductivity may be first formed on a substrate, and then a coating layer may be formed thereon to provide an anti-static function, or a low refractive layer may be introduced on the coating layer to implement a low reflection function.

Further, the layer, membrane, film or the like may be in any form of a single layer, a double layer, or a laminate type. The layer, membrane, film or the like may be formed by laminating a freestanding film with an adhesive, a cohesive film, or the like, or may be laminated on the coating layer by a method such as coating, vapor deposition, sputtering, or the like, but the present invention is not limited thereto.

Meanwhile, the hard coating layer may further include additives commonly used in the art, such as a photoinitiator, an organic solvent, a surfactant, a UV absorber, a UV stabilizer, an anti-yellowing agent, a leveling agent, an antifouling agent, a dye for improving the color value, etc., in addition to the above-mentioned binder resin, and inorganic fine particles. Further, the content thereof is not particularly limited as it can be variously adjusted within the range that does not deteriorate physical properties of the hard coating layer. However, they may be contained in an amount of about 0.01 to 30 parts by weight based on 100 parts by weight of the hard coating layer.

The surfactant may be a mono- or bi-functional fluorine-based acrylate, a fluorine-based surfactant, or a silicon-based surfactant. In this case, the surfactant may be contained in a form of being dispersed or cross-linked in the hard coating layer.

Further, the additive may include a UV absorber, or a UV stabilizer, and examples of the UV absorber may include a benzophenone-based compound, a benzotriazole-based compound, a triazine-based compound, and the like. Examples of the UV stabilizer may include tetramethyl piperidine, and the like.

Examples of the photoinitiator may include 1-hydroxycyclohexyl-phenyl ketone, 2-hydroxy-2-methyl-1-phenyl-1-propanone, 2-hydroxy-1-[4-(2-hydroxyethoxy)phenyl]-2-methyl-1-propanone, methylbenzoylformate, $\alpha,\alpha$-dimethoxy-$\alpha$-phenylacetophenone, 2-benzoyl-2-(dimethylamino)-1-[4-(4-morpholinyl)phenyl]-1-butanone, 2-methyl-1-[4-(methylthio) phenyl]-2-(4-morpholinyl)-1-propanone diphenyl(2,4,6-trimethylbenzoyl)-phosphine oxide, or bis(2,4,6-trimethylbenzoyl)-phenylphosphine oxide, and the like, but are not limited thereto. In addition, examples of commercially available products include Irgacure 184, Irgacure 500, Irgacure 651, Irgacure 369, Irgacure 907, Darocur 1173, Darocur MBF, Irgacure 819, Darocur TPO, Irgacure 907, Esacure KIP 100F, and the like. These photoinitiators can be used alone or in combination of two or more.

Examples of the organic solvent may include alcohol-based solvents such as methanol, ethanol, isopropyl alcohol and butanol; alkoxy alcohol-based solvents such as 2-methoxyethanol, 2-ethoxyethanol and 1-methoxy-2-propanol; ketone-based solvents such as acetone, methyl ethyl ketone, methyl isobutyl ketone, methyl propyl ketone and cyclohexanone; ether-based solvent such as propylene glycol monopropyl ether, propylene glycol monomethyl ether, ethylene glycol monoethyl ether, ethylene glycol monopropyl ether, ethylene glycol monobutyl ether, diethylene glycol monomethyl ether, diethyl glycol monoethyl ether, diethyl glycol monopropyl ether, diethyl glycol monobutyl ether and diethylene glycol-2-ethylhexyl ether; aromatic solvent such as benzene, toluene and xylene, and the like. These may be used alone or in combination.

Meanwhile, according to another embodiment of the present disclosure, there is provided a flexible display device including the cover window for a flexible display device of the embodiment.

The flexible display device may include a touch panel of a curved, bendable, flexible, rollable, or foldable mobile communication device, smartphone or tablet PC and various displays.

An example of the flexible display device is a flexible light emitting element display device.

For example, the organic light emitting diode (OLED) display may have a cover window of the flexible display device at an outer part in a direction in which light or a screen is emitted. And a cathode for providing electrons, an electron transport layer, an emission layer, a hole transport layer, and an anode for providing holes may be sequentially formed.

In addition, the organic light emitting diode (OLED) display may further include a hole injection layer (HIL) and an electron injection layer (EIL).

In order for the organic light emitting diode (OLED) display to function and act as a flexible display, the electrodes of the cathode and the anode and each component may use an elastic material in addition to using the polymer film as a cover window.

Another example of the flexible display device may be a rollable display or a foldable display.

The rollable display device may have various structures depending on application fields and specific forms, and may have a structure including a cover plastic window, a touch panel, a polarizing plate, a barrier film, a light emitting element (OLED element, etc.), a transparent substrate, and the like.

Advantageous Effects

According to the present disclosure, there are provided a flexible display device and a cover window for a flexible display device which exhibits high hardness while satisfying a property balance of flexibility and high hardness at the same time, and is hardly damaged by repetitive bending or folding operations, thereby easily applied to a bendable, flexible, rollable, or foldable mobile device, or display device.

Since the cover window for a flexible display device may have sufficient properties to replace tempered glass, or the like, it may not only be broken by pressure or force applied from the outside, but also may have characteristics of being sufficiently bent and folded. Moreover, it exhibits flexibility, high hardness, scratch resistance, and high transparency, and has little damage to the film even under repetitive and continuous bending or long-time folding. Accordingly, it may be usefully applied to a mobile device, a display device, a front board of various instrument panels, and a display unit with a bendable, flexible, rollable, or foldable type.

DETAILED DESCRIPTION OF THE EMBODIMENTS

Hereinafter, the function and effect of the present invention will be described in more detail through specific examples. However, these examples are for illustrative purposes only, and the invention is not intended to be limited by these examples.

Preparation Example A: Preparation of Coating Solution for Forming Hard Coating Layer Preparation Example A-1

As shown in Table 1 below, 30 g of trimethylolpropane triacrylate (TMPTA, manufactured by Cytec, Mw=296 g/mol, acrylate group equivalent weight=99 g/mol) as a trifunctional acrylate-based binder, 40 g of MU9800 (manufactured by Miwon, Mw=3500 g/mol, acrylate group equivalent weight=389 g/mol) as a 9-functional urethane acrylate-based binder, 30 g of MU9020 (manufactured by Miwon, Mw=4500 g/mol, acrylate group equivalent weight=450 g/mol) as a 10-functional urethane acrylate-based binder, 1 g of Irgacure 184 (manufactured by Ciba) as a photoinitiator, and 17.5 g of methyl ethyl ketone (MEK) were mixed to prepare an acrylate solution.

60 g of a solution in which silica particles S1 (average particle diameter: 20 nm, surface-modified with a methacrylate silane coupling agent) were dispersed in n-butyl acetate (normal butyl acetate) in an amount of 50 wt %, and 100 g of a solution in which silica particles S2 (average particle diameter: 40 nm, surface-modified with an acrylate silane coupling agent) were dispersed in methyl ethyl ketone (MEK) in an amount of 30 wt % were mixed with the resulting acrylate solution to prepare a coating solution for forming a hard coating layer.

Preparation Example A-2

A coating solution for forming a hard coating layer was prepared in the same manner as in Preparation Example A-1, except that 1) an acrylate solution was prepared using 26.1 g of methyl ethyl ketone, and 2) 50 g of the solution in which silica particles S2 were dispersed in methyl ethyl ketone (MEK) in an amount of 30 wt % was used.

Preparation Example A-3

A coating solution for forming a hard coating layer was prepared in the same manner as in Preparation Example A-1, except that 1) an acrylate solution was prepared using 21.8 g of methyl ethyl ketone, and 2) 75 g of a solution in which silica particles S3 (average particle diameter: 100 nm, surface-modified with an acrylate silane coupling agent) were dispersed in an amount of 40 wt % was used instead of 100 g of the solution in which silica particles S2 were dispersed in methyl ethyl ketone (MEK) in an amount of 30 wt %.

Preparation Example A-4

As shown in Table 1 below, 30 g of TMPTA (manufactured by Cytec, Mw=296 g/mol, acrylate group equivalent weight=99 g/mol), 40 g of MU9800 (manufactured by Miwon, Mw=3500 g/mol, acrylate group equivalent weight=389 g/mol), 30 g of MU9020 (manufactured by Miwon, Mw=4500 g/mol, acrylate group equivalent weight=450 g/mol), 1 g of Irgacure 184 (manufactured by Ciba), and 43.3 g of methyl ethyl ketone (MEK) were mixed to prepare a coating solution for forming a hard coating layer.

Preparation Example A-5

30 g of TMPTA (manufactured by Cytec, Mw=296 g/mol, acrylate group equivalent weight=99 g/mol), 40 g of MU9800 (manufactured by Miwon, Mw=3500 g/mol, acrylate group equivalent weight=389 g/mol), 30 g of MU9020 (manufactured by Miwon, Mw=4500 g/mol, acrylate group equivalent weight=450 g/mol), 1 g of Irgacure 184 (manufactured by Ciba), and 30.5 g of methyl ethyl ketone (MEK) were mixed to prepare an acrylate solution.

90 g of a solution in which silica particles S1 (average particle diameter: 20 nm, surface-modified with a methacrylate silane coupling agent) were dispersed in n-butyl acetate (normal butyl acetate) in an amount of 50 wt % was mixed with the resulting acrylate solution to prepare a coating solution for forming a hard coating layer.

Preparation Example A-6

30 g of TMPTA (manufactured by Cytec, Mw=296 g/mol, acrylate group equivalent weight=99 g/mol), 40 g of MU9800 (manufactured by Miwon, Mw=3500 g/mol, acrylate group equivalent weight=389 g/mol), 30 g of MU9020 (manufactured by Miwon, Mw=4500 g/mol, acrylate group equivalent weight=450 g/mol), 1 g of Irgacure 184 (manufactured by Ciba), and 24 g of methyl ethyl ketone (MEK) were mixed to prepare an acrylate solution.

112.5 g of a solution in which silica particles S3 (average particle diameter: 100 nm, surface-modified with an acrylate silane coupling agent) were dispersed in an amount of 40 wt % was mixed with the resulting acrylate solution to prepare a coating solution for forming a hard coating layer.

TABLE 1

| | | Acrylate-based binder (unit: g) | Acrylate-based binder (unit: g) | Acrylate-based binder (unit: g) | Acrylate-based binder (unit: g) | Acrylate-based binder (unit: g) | Acrylate-based binder (unit: g) | Acrylate-based binder (unit: g) |
|---|---|---|---|---|---|---|---|---|
| Acrylate-based binder (unit: g) | Cytec, TMPTA | 30 | 30 | 30 | 30 | 30 | 30 | 30 |
| | Miwon, MU9800 | 40 | 40 | 40 | 40 | 40 | 40 | 40 |
| | Miwon, MU9020 | 30 | 30 | 30 | 30 | 30 | 30 | 30 |
| Inorganic fine particles* (unit:g) | S1 | 30 | 30 | 30 | | | 45 | |
| | S2 | 30 | 15 | | | | | |
| | S3 | | | 30 | | | | 45 |

*In Table 1, the content of inorganic fine particles is represented by a net weight of only the inorganic fine particles excluding the solvent according to the weight percentage of the inorganic fine particles dispersed in the solvent.

Preparation Example B: Preparation of polyamide block copolymer

Preparation Example B-1

In a 500 mL 4-neck round-bottom flask (reactor) equipped with a stirrer, a nitrogen injector, a dropping funnel, and a temperature controller, 184 g of N,N-dimethylacetamide (DMAc) was placed with slowly blowing nitrogen. The temperature of the reactor was adjusted to −10° C., and then 0.030343 mol of 2,2'-bis(trifluoromethyl)-4,4'-biphenyl-diamine (TFDB) was dissolved.

0.000759 mol of isophthaloyl chloride (IPC) and 0.014716 mol of terephthaloyl chloride (TPC) were sequentially added thereto at about 5 minute-intervals, and stirred. Thereafter, an amide formation reaction was carried out at about −10° C. for about 60 minutes (first segment).

After 0.030343 mol of TFDB was added thereto and dissolved, 0.005007 mol of IPC and 0.010468 mol of TPC were sequentially added thereto at about 5 minute-intervals, and stirred. Thereafter, an amide formation reaction was carried out at about −10° C. for about 60 minutes (second segment).

After completion of the reaction, DMAc was added to dilute to a solid content of 5% or less, and then precipitated using 1 L of methanol. The precipitated solid was filtered and then dried at 100° C. under vacuum for about 6 hours or more to obtain a polyamide block copolymer in the form of solid (weight average molecular weight: about 417,201 g/mol).

Then, the polyamide block copolymer obtained above was dissolved in N,N-dimethylacetamide to prepare a polymer solution of about 12% (w/V).

The polymer solution was applied on a polyimide-based substrate (UPILEX-75s, manufactured by UBE), and the thickness of the polymer solution was uniformly controlled using a film applicator.

This was dried in a mathis oven at about 80° C. for about 15 minutes, cured at about 250° C. for about 30 minutes while flowing nitrogen, and then peeled from the substrate to obtain a polymer substrate including a polyamide block copolymer having a thickness of about 50.0 μm.

Preparation Examples B-2 and B-3

Polyamide block copolymers in the form of solid were obtained in the same manner as in Preparation Example B-1, except that the amounts of reactants added were changed as shown in Table 2 below (weight average molecular weight: about 401,117 g/mol).

Polymer substrates including a polyamide block copolymer having a thickness of about 50.0 μm were prepared in the same manner as in Preparation Example B-1.

Preparation Example B-4

In a 500 mL 4-neck round-bottom flask (reactor) equipped with a stirrer, a nitrogen injector, a dropping funnel, and a temperature controller, 184 g of N,N-dimethylacetamide (DMAc) was placed with slowly blowing nitrogen. The temperature of the reactor was adjusted to −10° C., and then 0.030343 mol of 2,2'-bis(trifluoromethyl)-4,4'-biphenyldiamine (TFDB) was dissolved.

0.001517 mol of isophthaloyl chloride (IPC) and 0.029432 mol of terephthaloyl chloride (TPC) were sequentially added thereto at about 5 minute-intervals, and stirred. Thereafter, an amide formation reaction was carried out at about −10° C. for about 60 minutes.

After completion of the reaction, DMAc was added to dilute to a solid content of 5% or less, and then precipitated using 1 L of methanol. The precipitated solid was filtered and then dried at 100° C. under vacuum for about 6 hours or more to obtain a polyamide block copolymer in the form of solid (weight average molecular weight: about 431,122 g/mol).

A polymer substrate including a polyamide block copolymer having a thickness of about 50.0 μm was prepared in the same manner as in Preparation Example B-1.

TABLE 2

|  | Segment | IPC (mol) | TPC (mol) | TFDB (mol) | IPC (mol %) | TPC (mol %) |
|---|---|---|---|---|---|---|
| Prep. Ex. B-1 | First segment | 7.5900E−04 | 1.4716E−02 | 0.03034 | 4.905 | 95.095 |
|  | Second segment | 5.0070E−03 | 1.0468E−02 | 0.03034 | 32.355 | 67.645 |
| Prep. Ex. B-2 | First segment | 1.9000E−04 | 3.6790E−03 | 0.00379 | 4.911 | 95.089 |
|  | Second segment | 5.5750E−03 | 2.1505E−02 | 0.02650 | 20.587 | 79.413 |
| Prep. Ex. B-3 | First segment | 7.7000E−04 | 1.4330E−02 | 0.01541 | 5.099 | 94.901 |
|  | Second segment | 4.4685E−03 | 1.0632E−02 | 0.01541 | 29.592 | 70.408 |
| Prep. Ex. B-4 | — | 1.5170E−03 | 2.9432E−02 | 0.03034 | 4.902 | 95.098 |

Experimental Example A: Measurement of Physical Properties of Polymer Substrate

The following properties were measured or evaluated for the polymer substrates including the polyamide block copolymer according to Preparation Example B, and the results are summarized in Table 3 below.

(1) Yellow Index (Y.I.)

The yellow index (Y.I.) of the polymer substrate was measured according to the method of ASTM E 313 using a COH-400 Spectrophotometer (manufactured by NIPPON DENSHOKU INDUSTRIES).

(2) Haze

The haze of the polymer substrate was measured according to the method of ASTM D1003 using a COH-400 Spectrophotometer (manufactured by NIPPON DENSHOKU INDUSTRIES).

(3) Pencil Hardness

The maximum hardness without scratches was confirmed for the hard coating layer formed on the front surface in each cover window of Examples and Comparative Example after moving a pencil back and forth three times at an angle of degrees under a load of 750 g using a pencil hardness tester in accordance with JIS K5400-5-4.

(4) Modulus and Elongation

The modulus (GPB) and elongation (%) of the film were measured according to the method of ISO 527-3 using Universal Testing Systems (Instron© 3360).

(5) Folding Endurance

The folding endurance of the film was measured according to the method of ISO 5626 using a folding endurance tester.

Specifically, a specimen (1 cm*7 cm) of the film was loaded into the folding endurance tester at 25° C., and folded to an angle of 135° at a rate of 175 rpm on the left and right sides of the specimen, with a radius of curvature of 0.8 mm and a load of 250 g, until the specimen was fractured. The number of reciprocating bending cycles was measured as the folding endurance.

TABLE 3

| | YI | Haze | Pencil hardness | Modulus (Gpa) | Elongation (%) | MIT (0.8R) |
|---|---|---|---|---|---|---|
| Prep. Ex. B-1 | 2.41 | 0.63 | 3H | 7.15 | about 15 | about 9,000 cycles |
| Prep. Ex. B-2 | 2.81 | 0.82 | 3H | 7.21 | about 15 | about 9,000 cycles |
| Prep. Ex. B-3 | 3.79 | 0.81 | 3H | 7.11 | about 15 | about 9,000 cycles |
| Prep. Ex. B-4 | 6.12 | 2.23 | 3H | 7.77 | about 10 | about 7,000 cycles |

Examples and Comparative Example 1: Cover Window for Flexible Display Device

The coating composition prepared in Preparation Example A was applied to both surfaces of the polymer substrate prepared in Preparation Example B by a bar coating method, and dried at 90° C. under an air atmosphere for 2 minutes. An optical laminate was prepared by photo-curing with a metal halide lamp having a wavelength of 290 to 320 nm (amount of light: 200 mJ/cm$^2$). After the curing was completed, the thickness of the coating layer formed on both surfaces was 10 μm, respectively.

Examples and Comparative Example are shown in Tables 4 and 5 below.

TABLE 4

| | Example 1 | Example 2 | Example 3 | Example 4 |
|---|---|---|---|---|
| Coating composition | Prep. Ex. A-1 | Prep. Ex. A-2 | Prep. Ex. A-3 | Prep. Ex. A-1 |
| Polymer substrate | Prep. Ex. B-1 | Prep. Ex. B-1 | Prep. Ex. B-1 | Prep. Ex. B-2 |
| Total thickness | 70 μm | 70 μm | 70 μm | 70 μm |
| Thickness of coating layer | 10 μm | 10 μm | 10 μm | 10 μm |

TABLE 5

| | Comparative Example 1 |
|---|---|
| Coating composition | Prep. Ex. A-1 |
| Polymer substrate | Prep. Ex. B-4 |
| Total thickness | 70 μm |
| Thickness of coating layer | 10 μm |

Experimental Example: Measurement of Physical Properties of Optical Laminate

Experimental Example 1: Pencil Hardness

The maximum hardness without scratches was confirmed for the hard coating layer formed on the front surface in each cover window of Examples and Comparative Example after moving a pencil back and forth three times at an angle of degrees under a load of 750 g using a pencil hardness tester in accordance with JIS K5400-5-4.

Experimental Example 2: Transmittance and Haze

The transmittance and haze of each cover window of Examples and Comparative Example were measured using a spectrophotometer (apparatus name: COH-400).

Experimental Example 3: Yellow Index (Y.I.)

The yellow index (Y.I.) of each cover window of Examples and Comparative Example was measured using a spectrophotometer (apparatus name: COH-400 manufactured by NIPPON DENSHOKU INDUSTRIES) in accordance with ASTM E 313.

Experimental Example 4: Bending Test

Each cover window of Examples and Comparative Example was interposed and wound on cylindrical mandrels with various diameters, and then the minimum diameter at which no crack occurred was measured in accordance with JIS K5600-5-1.

Experimental Example 5: Coating Layer Adhesion

Scratches were made to make 100 lattices using a cutter knife on the entire surface of the hard coating layer formed on the front surface of each cover window of Examples and Comparative Example within a size of 1 cm*1 cm to 2 cm*2 cm, and Nichiban Tape (CT-24) was attached thereon to perform a peeling test. The peeling test was performed twice on the same surface to evaluate the adhesion from 5B (no peeling) to OB (full peeling) depending on the peeled level.
  5B (no peeled parts)
  4B (1 to 5 lattices containing peeled parts)
  3B (6 to 15 lattices containing peeled parts)
  2B (16 to 35 lattices containing peeled parts)
  11B (36 to 50 lattices containing peeled parts)
  OB (51 or more lattices containing peeled parts)

Experimental Example 6: Scratch Resistance Test

For the hard coating layer formed on the front surface of each cover window of Examples and Comparative Example, a load of 500 gf was applied to steel wool (#0000) and reciprocated 500 times at 30 rpm to evaluate the surface of the hard coating film. When 1 or less scratch with 1 cm or less was observed with the naked eye, it was judged as excellent.

Experimental Example 7: Bending Durability Test

Figure 1:
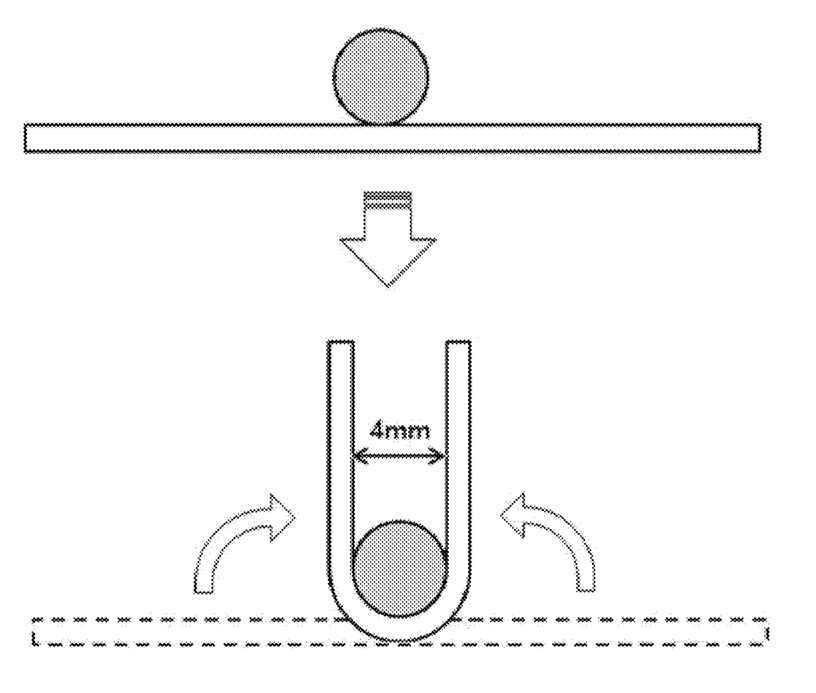
FIG. 1 schematically shows a method of performing a bending durability test and a bending stability test of Experimental Examples 7 and 8.

FIG. 1 schematically shows a method of performing a bending durability test and a bending stability test on a film according to an embodiment of the present disclosure.

Each film of Examples and Comparative Examples was cut, but laser cutting was performed into a size of 80×140 mm so as to minimize fine cracks at the edge portions. The laser cut film was placed on a measuring equipment and set so that an interval between folded portions was 4 mm. Then, a process of folding and unfolding both sides of the film at 90 degrees with respect to the bottom at room temperature was repeated 10,000 times by continuous operations (the speed at which the film was folded was once every 1.5 seconds).

After repeating 10,000 times, the film was peeled off, and it was observed whether or not cracks of 3 mm or more in length occurred (OK, NG). When cracks did not occur, the film was again folded 10,000 times and whether or not cracks occurred was repeatedly observed, thereby measuring the maximum number of repetitions that cracks do not occur. When cracks did not occur up to 100,000 times of repetitions, the bending durability was judged to be excellent.

Experimental Example 8: Bending Stability Test

Similarly to the bending durability test, each film of Examples and Comparative Examples was cut, but laser cutting was performed into a size of 80×140 mm so as to minimize fine cracks at the edge portions.

The laser cut film was placed on a fixing device and set so that an interval between folded portions was 4 mm. After leaving both sides of the film folded at 90 degrees with respect to the bottom for 24 hours, the film was then peeled off and turned over so that the folded portion went downward. Then, a □(square)-shaped SUS structure was placed thereon and the film was fixed. The 3D image of the film shape was measured with a noncontact-type surface roughness measuring instrument (PLUTO 681, Dukin Co., Ltd., use of 605 nm laser, resolution 0.1 μm), and the maximum value of the height Z lifted from the bottom was measured as the bending stability.

In order to measure the recovery of the film, the film in which the bending stability was measured was allowed to stand at room temperature for 1 hour, and then the maximum value of the lifted height Z was again measured. A change in appearance of the folded portion was visually observed. When Z is 0.1 mm or less and the change in appearance such as traces on the folded portions is small, it is judged to be OK, and when Z exceeds 0.1 mm or a large number of traces remain on the folded portions, it is judged to be NG.

The results of measuring the physical properties of Examples 1 to 5 and Comparative Example are shown in Tables 6 and 7 below.

TABLE 6

|  | Example 1 | Example 2 | Example 3 | Example 4 |
|---|---|---|---|---|
| Transmittance | 91.89% | 91.79% | 92.05% | 91.90% |
| Haze | 0.42% | 0.40% | 0.46% | 0.56% |
| YI | 2.25 | 2.00 | 2.35 | 2.40 |
| Pencil Hardness | 7 H | 8 H | 7 H | 8 H |
| Coating layer adhesion | OK | OK | OK | OK |
| Scratch resistance | Excellent | Excellent | Excellent | Excellent |
| Flexibility test | 4 mm | 4 mm | 4 mm | 4 mm |
| Bending durability | 100,000 times Ok | 100,000 times Ok | 100,000 times Ok | 100,000 times Ok |
| Bending stability | 0.1 mm | 0.1 mm | 0.1 mm | 0.2 mm |

TABLE 7

| Flexibility test | 6 mm |
|---|---|
| Bending durability | NG (40,000 times) |
| Bending stability | 0.3 mm |

As shown in Table 3, the cover windows for a flexible display device of Examples satisfied sufficient flexibility while simultaneously exhibiting a low yellow index of 2.5 or less and glass-level high hardness. Particularly, they were confirmed that the film was hardly damaged by repetitive bending or folding operations, thereby easily applied to a bendable, flexible, rollable, or foldable mobile device, or display device.

On the other hand, the cover window of Comparative Example had a relatively low surface hardness or did not exhibit bending durability enough to be used as a cover window for a flexible display device. In addition, it was confirmed that the cover window of Comparative Example had a lower transmittance, a higher haze, or a higher yellow index than that of Examples.

The invention claimed is:

1. A cover window for a flexible display device, comprising a polymer substrate comprising a polyamide resin; and a hard coating layer formed on at least one surface of the polymer substrate,
   wherein the polyamide resin comprises a first polyamide segment and a second polyamide segment, each polymide segment containing a benzene-1,3-dicarbonyl group and a benzene-1,4-dicarbonyl group in a different molar ratio,
   the polymer substrate has a yellow index of 4.00 or less as measured in accordance with STM E 313, and
   an elastic modulus of 4 to 9 GPa as measured at a strain rate of 12.5 mm/min in accordance with ISO 527-3.

2. The cover window for a flexible display device of claim 1,
   wherein no crack occurs on the cover when the cover window is wound on a mandrel having a diameter of 3 mm.

3. The cover window for a flexible display device of claim 1,
   wherein the hard coating layer has a pencil hardness of at least 5H under a load of 750 g.

4. The cover window for a flexible display device of claim 1,
   wherein the cover window has a transmittance of at least 90.0% with respect to light having a wavelength of 550 nm and a haze of 0.6% or less.

5. The cover window for a flexible display device of claim 1,
wherein the cover window has a yellow index of 3.0 or less.

6. The cover window for a flexible display device of claim 1,
wherein the polyamide resin is a polyamide block copolymer comprising
A) an amide bond between an aromatic diamino group and a benzene-dicarbonyl group; and
B) b1) the first polyamide segment comprising 20 mol % or less of the benzene-1,3-dicarbonyl group based on a total of the benzene-1,3-dicarbonyl group and the benzene-1,4-dicarbonyl group, and b2) the second polyamide segment comprising more than 20 mol % of the benzene-1,3-dicarbonyl group based on a total of the benzene-1,3-dicarbonyl group and the benzene-1,4-dicarbonyl group.

7. The cover window for a flexible display device of claim 6,
wherein a molar ratio of the first polyamide segment to the second polyamide segment is 1:0.5 to 1:10.

8. The cover window for a flexible display device of claim 6,
wherein the polymide block copolymer comprises the benzene dicarbonyl group of a total of 5 to 25 mol % based on a total of the benzene-1,3-dicarbonyl group and the benzene-1,4-dicarbonyl group.

9. The cover window for a flexible display device of claim 6,
wherein the first polyamide segment has 2 mol % or more and 20 mol % or less of the benzene-1,3-dicarbonyl group based on a total of the benzene-1,3-dicarbonyl group and the benzene-1,4-dicarbonyl group contained in the first polymide segment.

10. The cover window for a flexible display device of claim 6,
wherein the second polyamide segment has a ratio of isophthaloyl chloride to a total of the benzene-1,3-dicarbonyl group and the benzene-1,4-dicarbonyl group of more than 20 mol % and 40 mol % or less.

11. The cover window for a flexible display device of claim 6,
wherein the aromatic diamino group has a diamino group derived from at least one selected from the group consisting of 2,2'-bis(trifluoromethyl)-4,4'-biphenyldiamine, 2,2'-dimethyl-4,4'-diaminobenzidine, 4,4'-diaminodiphenyl sulfone, 4,4'-(9-fluorenylidene)dianiline, bis(4-(4-aminophenoxy)phenyl)sulfone, 2,2',5,5'-tetrachlorobenzidine, 2,7-diaminofluorene, 4,4-diaminooctafluorobiphenyl, m-phenylenediamine, p-phenylenediamine, 4,4'-oxydianiline, 2,2'-dimethyl-4,4'-diaminobiphenyl, 2,2-bis[4-(4-aminophenoxy)phenyl]propane, 1,3-bis(4-aminophenoxy)benzene, and 4,4'-diaminobenzanilide.

12. The cover window for a flexible display device of claim 6,
wherein the polyamide block copolymer has a weight average molecular weight of 10,000 to 700,000 g/mol.

13. The cover window for a flexible display device of claim 1,
wherein the polymer substrate has an elongation of at least 10% as measured in accordance with ISO 527-3.

14. The cover window for a flexible display device of claim 1,
wherein the polymer substrate has a thickness of 5 to 300 µm.

15. The cover window for a flexible display device of claim 1,
wherein the hard coating layer comprises a binder resin and inorganic nanoparticles, and has a thickness of 5 µm to 50 µm.

16. A flexible display device, comprising the cover window for a flexible display device of claim 1.

* * * * *